United States Patent [19]

Abe

[11] Patent Number: 5,072,391

[45] Date of Patent: Dec. 10, 1991

[54] DIAGNOSTIC SYSTEM FOR A MOTOR VEHICLE

[75] Inventor: Kunihiro Abe, Higashimurayama, Japan

[73] Assignee: Fuji Jukogyo Kabushiki Kaisha, Tokyo, Japan

[21] Appl. No.: 411,554

[22] Filed: Sep. 22, 1989

[30] Foreign Application Priority Data

Sep. 28, 1988 [JP] Japan .............................. 63-243970

[51] Int. Cl.$^5$ .......................................... G01M 15/00
[52] U.S. Cl. ......................... 364/424.04; 364/424.03; 364/431.01; 73/117.2; 340/439
[58] Field of Search ...................... 364/424.03, 424.04, 364/550, 551.01, 431.01, 431.04, 431.12, 132; 73/117.2, 117.3; 340/438, 459

[56] References Cited

U.S. PATENT DOCUMENTS

| | | | |
|---|---|---|---|
| 4,782,449 | 11/1988 | Brinker et al. | 364/132 |
| 4,805,085 | 2/1989 | Mogi et al. | 364/132 |
| 4,839,530 | 6/1989 | Greenwood | 340/459 |
| 4,843,557 | 6/1989 | Ina et al. | 340/459 |
| 4,862,371 | 8/1989 | Maekawa | 364/551.01 |
| 4,903,191 | 2/1990 | Fries | 364/132 |

FOREIGN PATENT DOCUMENTS 58-12848  1/1983  Japan.
59-61740  4/1984  Japan.

*Primary Examiner*—Gary Chin
*Attorney, Agent, or Firm*—Martin A. Farber

[57] ABSTRACT

A diagnostic system for diagnosing an electronic control system of a vehicle has a diagnostic device having a memory storing diagnosis programs for diagnosing the electronic control system. The electronic control system has another memory storing programs for diagnosing itself. The diagnostic device and the electronic control system are selectively designated as a master and slave. The electronic control system is diagnosed in accordance with the program in the device designated as the master.

8 Claims, 9 Drawing Sheets

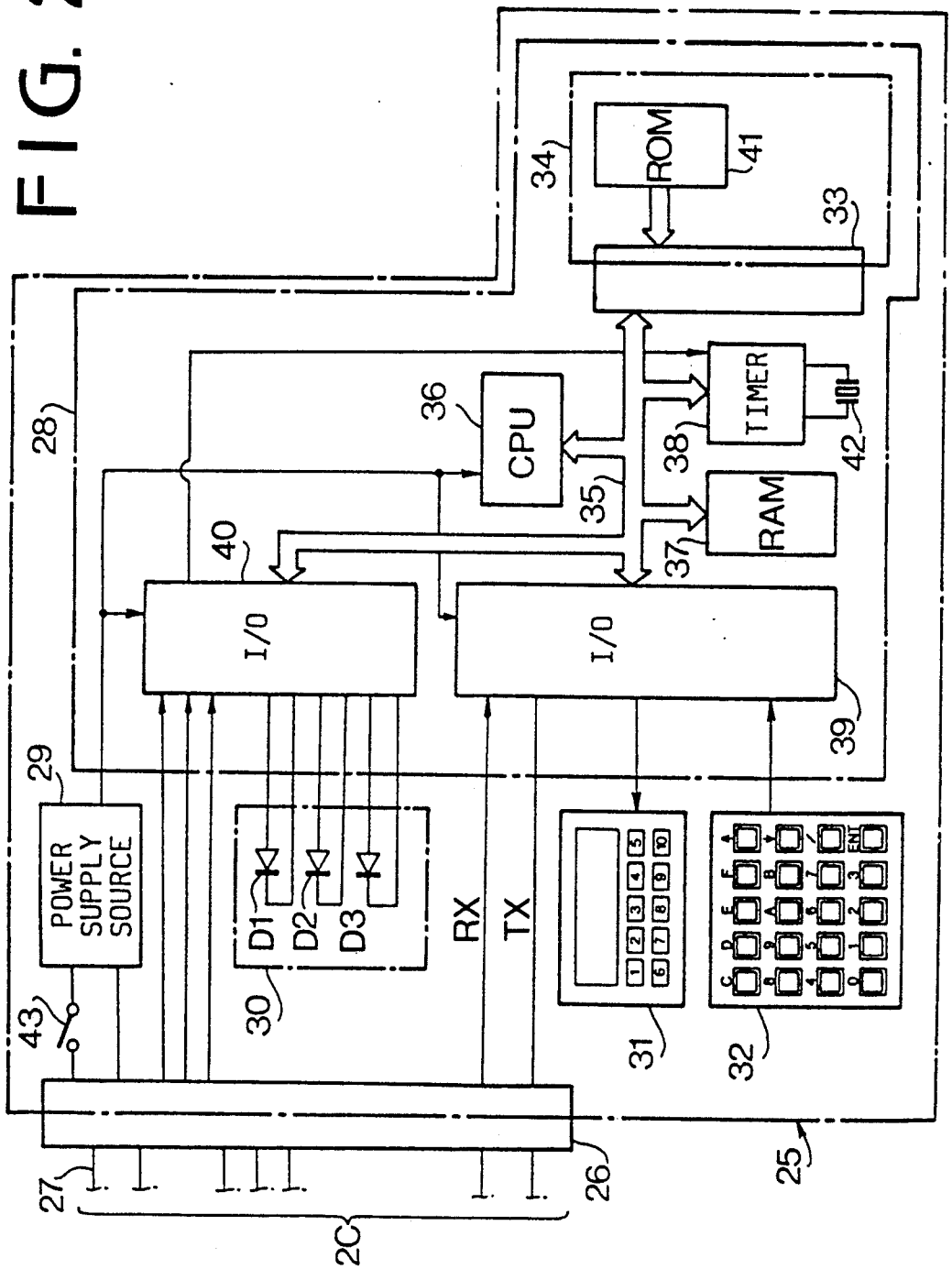

DIAGNOSTIC SYSTEM FOR A MOTOR VEHICLE

BACKGROUND OF THE INVENTION

The present invention relates to a diagnostic system for a motor vehicle.

Recently, a motor vehicle has been equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. If malfunctioning of the components and sensors occurs, the engine does not properly operate.

However, because of the complexity of the electronic control system, it is difficult to immediately find out the trouble. Accordingly, a diagnostic device for easily checking the electronic control system should be provided as equipment in an auto shop.

Japanese Patent Application Laid Open 59-61740 discloses a diagnostic system where signaling lamps provided on the vehicle are lighted or flashed when abnormalities occur in the sensors and actuators such as injectors. However, the actual conditions of the defective sensors and actuators cannot be represented by the lamps.

Japanese Patent Application Laid-Open 58-12848 discloses a diagnostic system in which an exclusive checking device is provided for measuring the pulse duration of fuel injection and engine speed, and for checking whether the idling speed is normal. The checking device is provided for diagnosing only a designated, specific type of a motor vehicle.

FIG. 6 shows a recently proposed diagnostic system which comprises a diagnostic device 102 and a memory cartridge 103 detachably attached to the device 102. The memory cartridge 103 has a memory such as a ROM for storing diagnosis programs and fixed data for the type and the model year of a motor vehicle 100. Various cartridges 103 for all vehicle types and models are provided and a cartridge for a vehicle to be diagnosed is selected and attached to the diagnosis device 102. Two-way communication between the cartridge 103 and an electronic control unit 101 on the vehicle 100 is performed for diagnosing the electronic control unit 101. Thus, various types of vehicles can be diagnosed by the diagnostic device.

The electronic control unit 101 has a self-diagnosis function which operates to store trouble data in a memory when trouble occurs in equipment such as sensors and actuators.

However, addresses for storing the trouble data in the memory and a conversion rate for converting data to physical values differ with different types and models of vehicles.

Additionally, in order to diagnose the electronic control system in detail, two or more memory cartridge must be provided. Consequently, diagnosis operation efficiency is reduced and the cost increased with an increase of the nummber of the memory cartridge.

SUMMARY OF THE INVENTION

The object of the present invention is to provide a diagnostic system which performs diagnosis of a motor vehicle without taking account of the type or model of the vehicle and may diagnose the vehicle in more detail at low cost.

According to the present invention, there is provided a diagnostic system for diagnosing an electronic control system of a motor vehicle, the electronic control system having sensing means for detecting operating conditions of the motor vehicle and first memory means for storing data from the sensing means, and the diagnostic system having a diagnostic device comprising a display for displaying diagnosis data, a control unit, a keyboard for inputting signals into the control unit, and connecting means for connecting the diagnostic device with the electronic control system.

The diagnostic system comprises second memory means provided in the diagnostic device and storing diagnosis programs for diagnosing the electronic control system, third memory means being provided in the electronic control system and storing diagnosis programs for diagnosing the electronic control system, designating means provided in the diagnostic device for selectively designating the electronic control system or the diagnostic device as a master or a slave to provide master mode and slave mode, and the electronic control system and the diagnostic device each having means for diagnosing the electronic control system in accordance with its own diagnosis programs when designated as the master.

The other objects and features of this invention will become understood from the following description with reference to the accompanying drawings.

BRIEF DESCRIPTION OF DRAWINGS

FIGS. 2a and 2b show a block diagram of an electronic control system and the diagnostic system;

DETAILED DESCRIPTION OF THE PREFERRED EMBODIMENT

Figure 1:
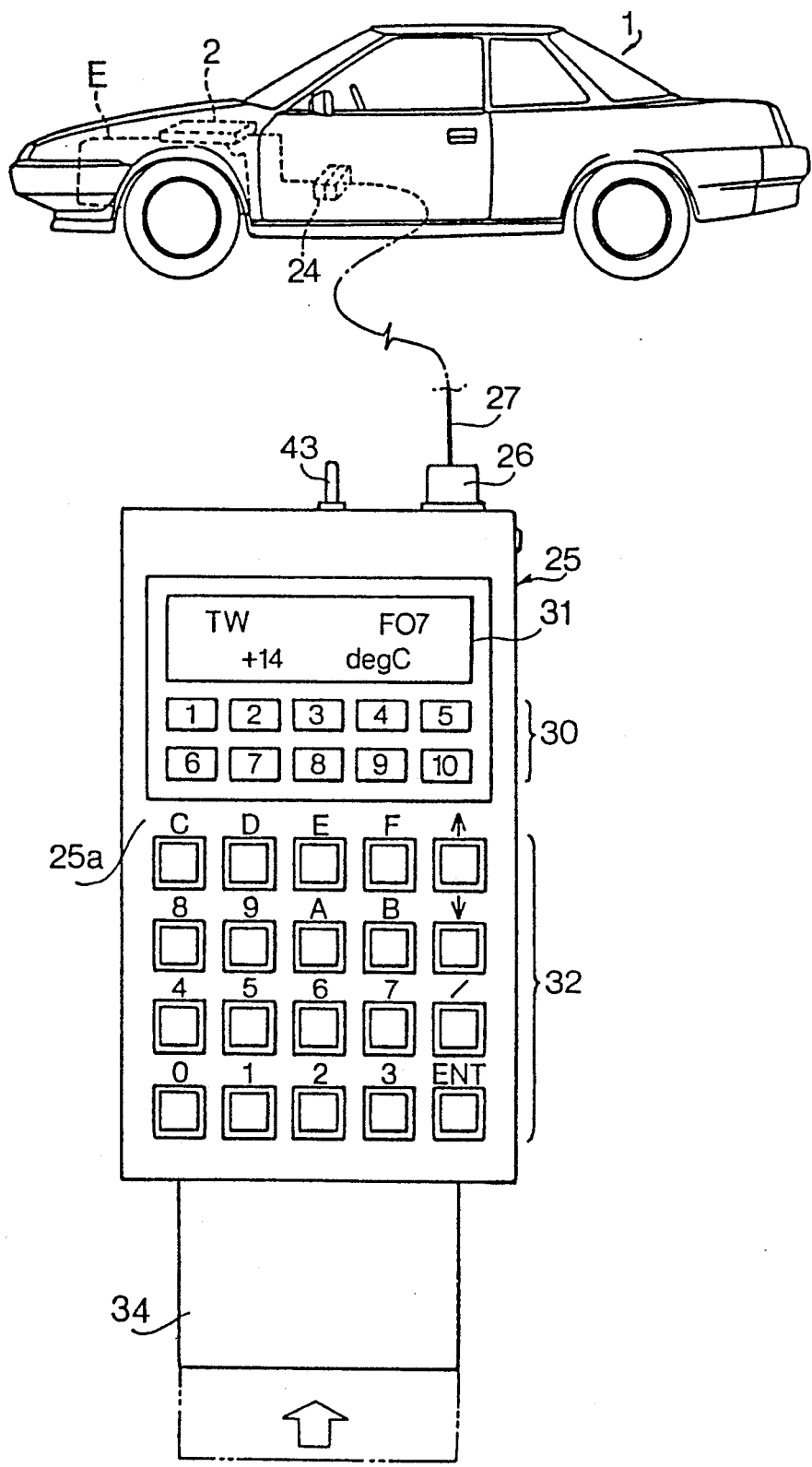
FIG. 1 is a schematic illustration of a diagnostic system according to the present invention.

Referring to FIG. 1, an automobile 1 is equipped with an electronic control system S comprising an electronic control unit 2, a plurality of sensors 9, 10, 11, 13, 15, 17, and switches 12, 14, 16 and a plurality of actuators and other elements 19-23, 23a for controlling various components of an engine E. The electronic control unit 2 is connected to an external connector 24. A portable diagnostic device 25 comprising a microcomputer is housed in a case 25a and has a connector 26, to which the connector 24 of the unit 2 is connected through an adapter harness 27.

The diagnostic device 25 has a power switch 43, a liquid crystal display 31, an indicator section 30 consisting of a plurality of indicators of LED, a keyboard 32, a control unit 28 including a connector 33, and a detachable memory cartridge 34. The connector 33 is provided for connecting a detachable memory cartridge 34.

Figure 2A:
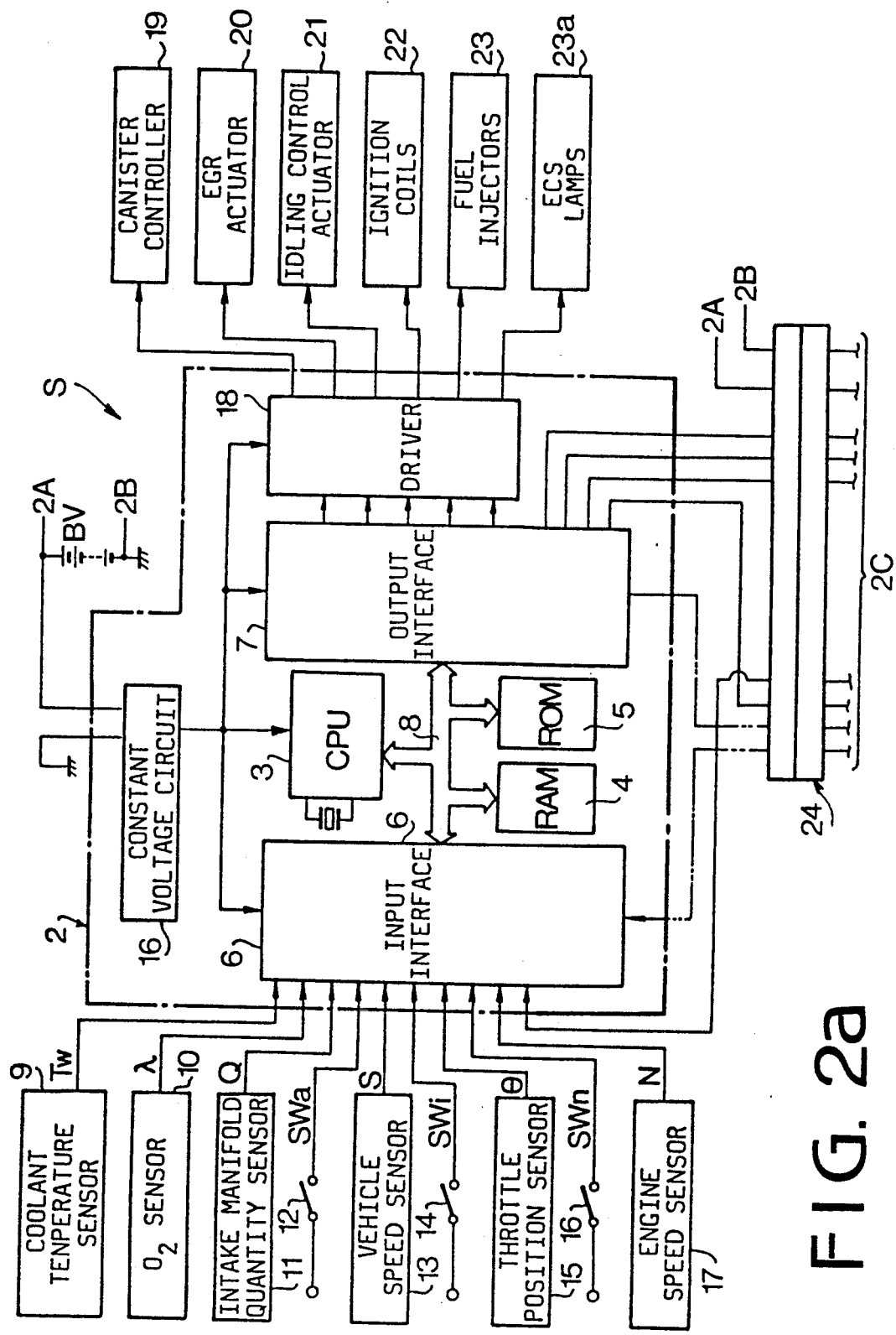

Referring to FIGS. 2a and 2b, the electronic control unit 2 comprises a central processor unit (CPU) 3, a RAM 4, a ROM 5, an input interface 6 and an output interface 7. The CPU 3, RAM 4, ROM 5, and the input and output interfaces 6 and 7 are connected to each other through a bus line 8. The ROM 5 stores a control program and an ordinary diagnosis program in predetermined addresses thereof. When the control unit 2 is in a master mode and the diagnostic device 25 is in a slave mode, diagnosis is performed in accordance with the diagnosis program stored in the ROM 5. Power is supplied to the CPU 3, the input and output interfaces 6 and 7, and a driver 18 from a source BV through a constant voltage circuit 16.

The input interface 6 is applied with a coolant temperature signal Tw from a coolant temperature sensor 9, an air-fuel ratio feedback signal λ from an $O_2$ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal $\theta$ from a throttle position sensor 15, a neutral positioning signal SWn from a neutral switch 16 in a transmission of the vehicle and an engine speed signal N from an engine speed sensor 17. These signals are stored in the RAM 4 after processing data in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22 and fuel injectors 23.

The driver 18 further applies signals to signaling lamps 23a. The signaling lamps 23a are provided in the electronic control unit 2 for indicating an abnormality in the unit 2. The unit 2 has a self-diagnostic function for diagnosing the condition of the equipment such as the sensors and the actuators. When an abnormality is detected in the unit 2 by the self-diagnosis function, a corresponding trouble code is read out from the ROM 5 so as to turn on or flash a plurality of the lamps 23a, thereby indicating the trouble code.

The diagnostic device 25 has a control unit 28 and a power supply source 29. The control unit 28 comprises a CPU 36, a RAM 37, input/output (I/0) interfaces 39 and 40, a timer 38 and a ROM 41 in the memory cartridge 34. These elements are connected to each other through a bus line 35. A clock pulse generator 42 is provided for generating synchronizing pulses. Inputs of the I/0 interface 40 are connected to the output interface 7 of the control unit 2 through connectors 24 and 26 and the harness 27 so as to receive output signals of the sensors and switches 9 to 17. Outputs of the interface 40 are connected to the indicator section 30. Inputs of the I/0 interface 39 are connected to the keyboard 32 for being applied with a mode code dependent on the operation of the keyboard 32, and to the output interface 7. Outputs of the interface 39 are connected to the input interface 6 of the electronic control unit 2 and the display 31 of the diagnostic device 25. The power source 29 for supplying the power to the CPU 36 and I/0 interfaces 39 and 40 is connected to the source BV through the power switch 43.

The memory cartridge 34 selected for diagnosing the control unit 2 is connected in the diagnostic device 25 through the connector 33. The ROM 41 is provided in the memory cartridge 34 as a memory and stores special programs such as a statistic processing program of for statistically processing diagnosis data, a detailed diagnosis program for a detailed diagnosis of particular sensors, actuators and others. These programs are performed by selecting a corresponding cartridge 34 and by designating the diagnostic device 25 as a master.

Figure 3:
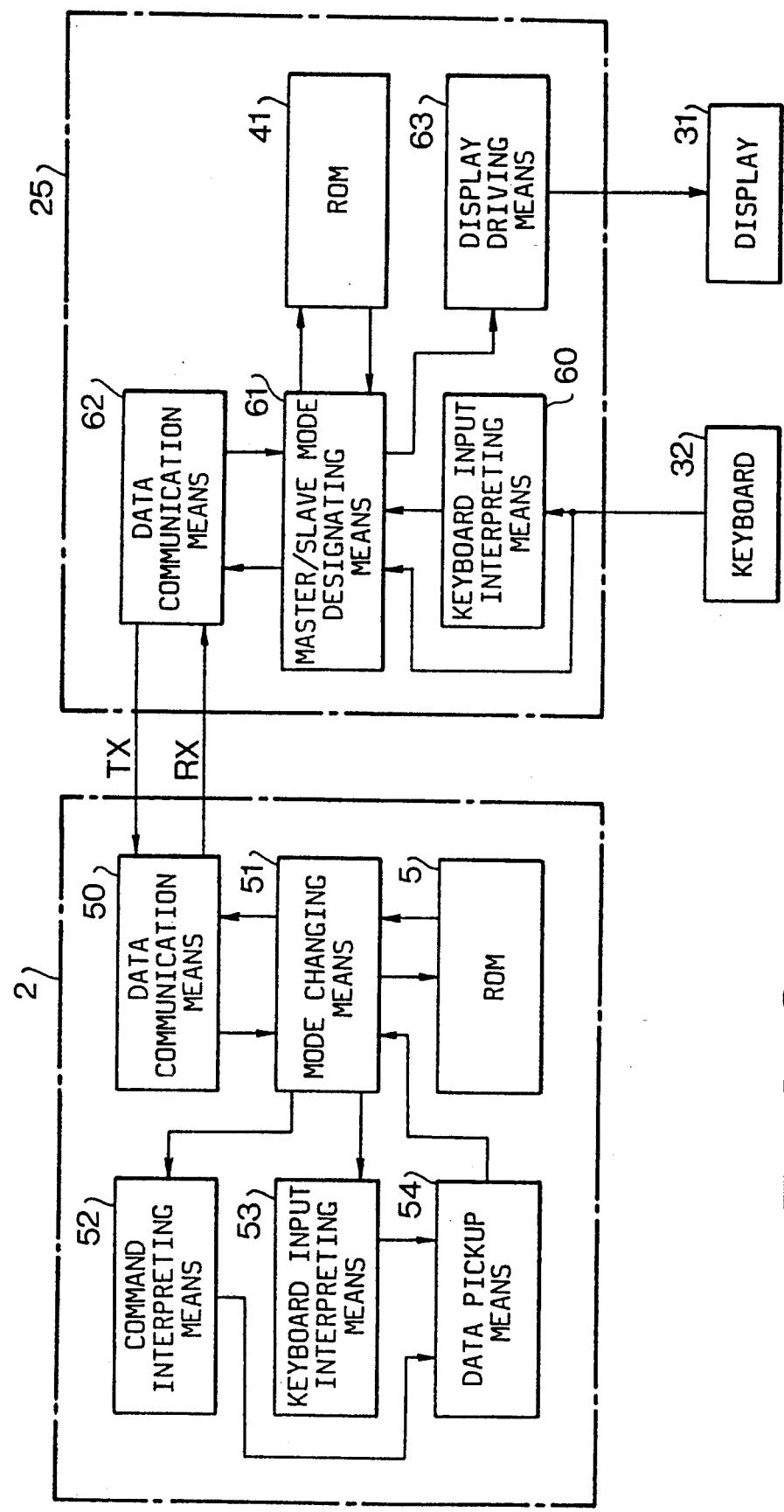
FIG. 3 is a block diagram showing a main part of the diagnostic system.

Referring to FIG. 3, the electronic control unit 2 has a data communication means 50 provided for receiving a command signal Tx fed from the diagnostic device 25 and producing a data signal Rx which is applied to the diagnostic device 25. A mode changing means 51 is provided for changing the mode of the control unit 2 between a master mode and a slave mode in accordance with an input signal from the diagnostic device 25 through the data communication means 50. When the control unit 2 is in the master mode, the trouble diagnosis is performed in accordance with the diagnosis program stored in the ROM 5.

A command interpreting means 52 is provided for interpreting the command signal fed from the diagnostic device 25 when the control unit 2 is in the slave mode. A keyboard input interpreting means 53 is provided for interpreting an input code input through the keyboard 32 when the control unit 2 is in the master mode. In accordance with a signal from the interpreting means 52 or 53, a data pick ups means 54 pickups diagnosis data stored in the RAM 4.

The diagnostic device 25 has a keyboard input interpreting means 60 provided for interpreting the input code input through the keyboard 32 when the diagnostic device 25 is in the master mode. A master/slave mode designating means 61 is provided for selectively designating the control unit 2 and the diagnostic device 25 as the master and slave in accordance with a predetermined command input. For example, when the control unit 2 is a master, the diagnostic device 25 is a slave. A display driving means 63 produces a signal in accordance with various data fed from the control unit 2 for driving the display 31. Further, a data communication means 62 and ROM 41 are provided.

Before performing the diagnosis program, the control unit 2 is connected to the diagnostic device 25 through the harness 27 and the cartridge 34 is attached in the diagnostic device 25. The engine is started, and the following diagnosis program is performed under the running condition of the engine. When the diagnostician operates the keyboard 32 to input a start signal, the master/slave mode designating means 61 produces a master designating signal to the control unit 2 through the data communication means 62 and 50.

Figure 4A:
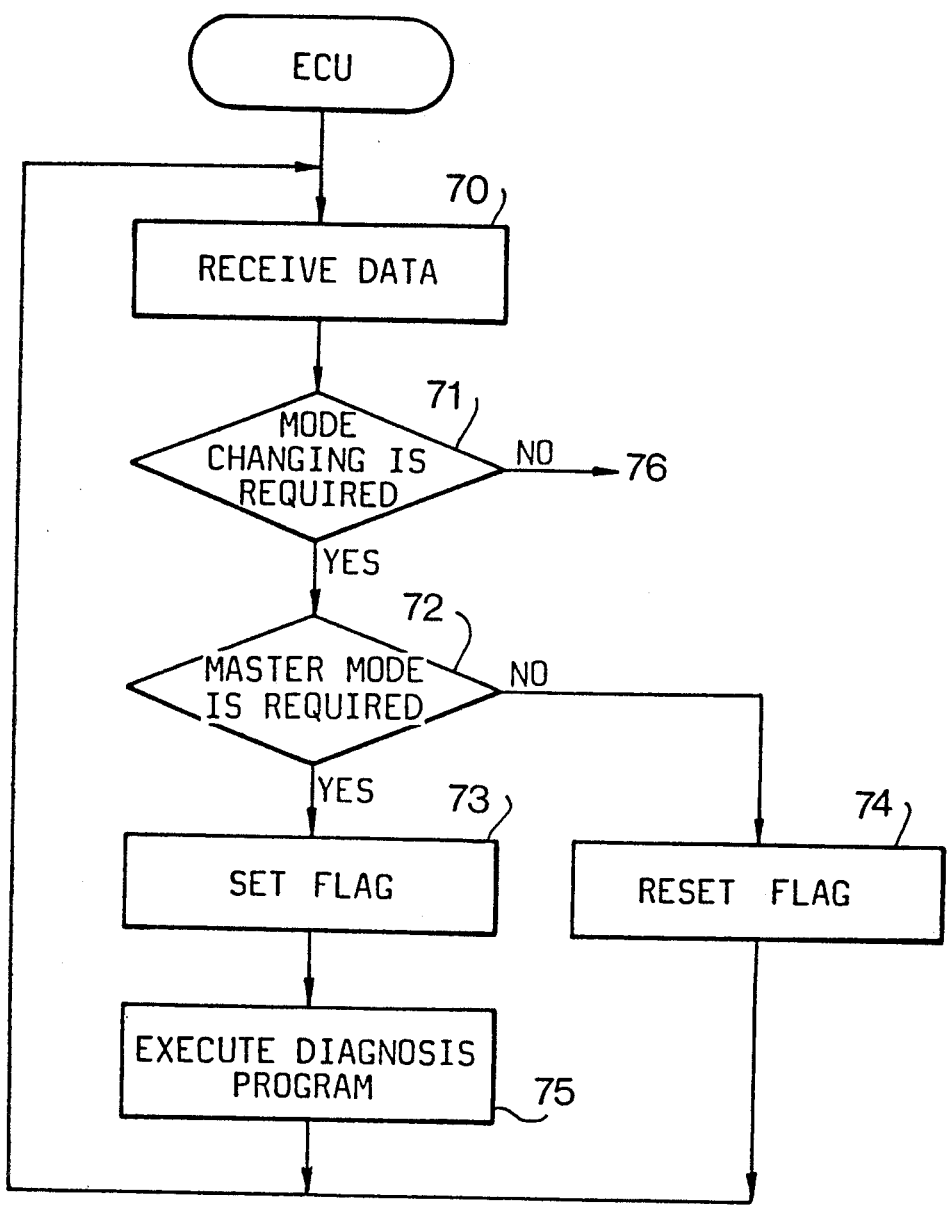
FIGS. 4a and 4b are flowcharts showing diagnosis operation in an electronic control system.
Figure 4B:
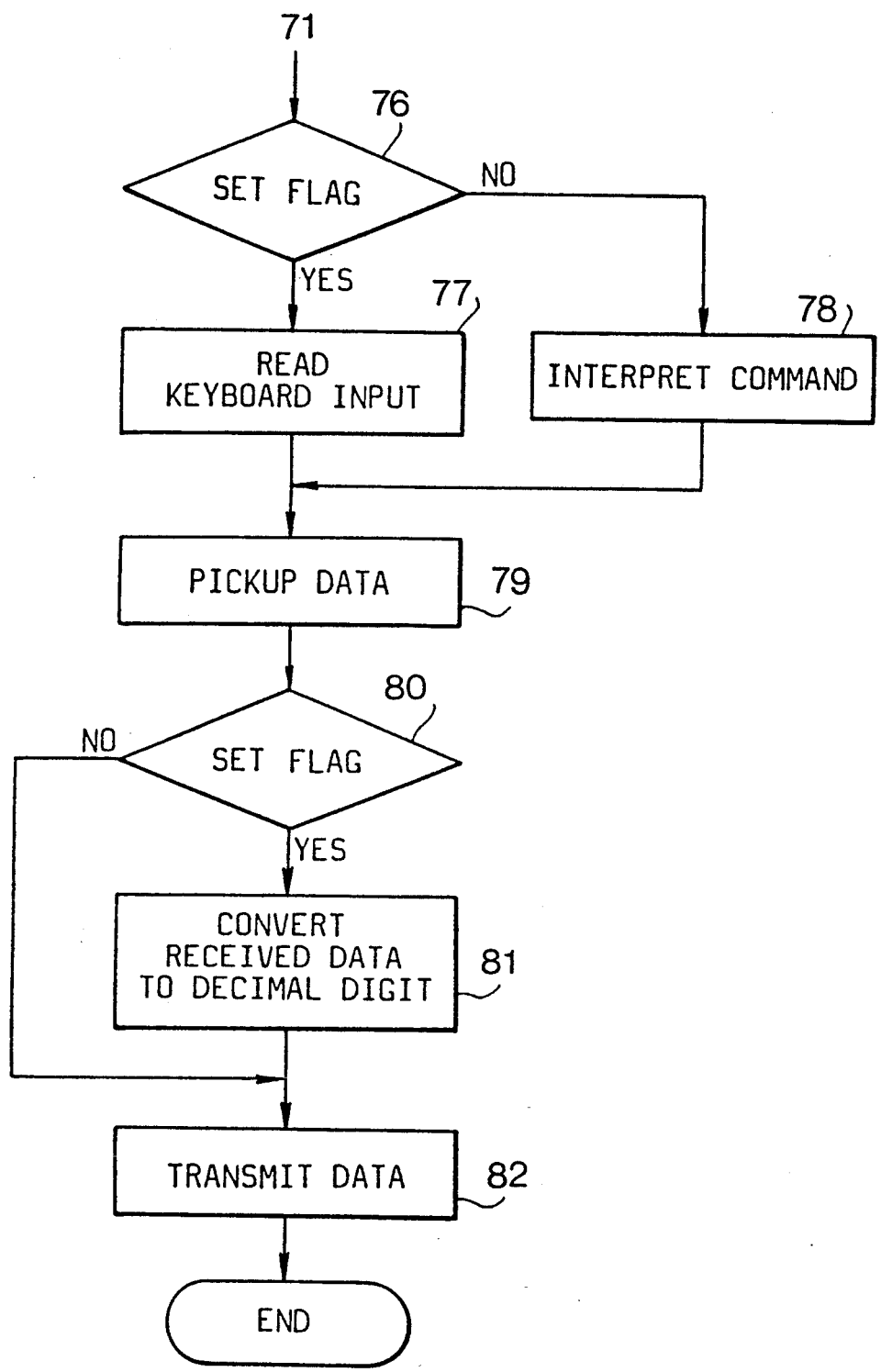

Referring to FIG. 4 showing the operation of the control unit 2, at a step 70, the master designating signal from the diagnostic device 25 is received in the data communication means 50. At a step 71, it is determined whether a change of mode is required or not at the mode changing means 51. Since mode changing is required, the program proceeds to a step 72. Unless mode changing is required, the program goes to a step 76. At step 72, it is determined whether the requirement is changing to the master or not. Since changing to the master is required, the program goes to a step 73 where a flag is set so that the control unit 2 enters master mode and the program proceeds to a step 75. Unless changing to the master is determined at step 72, the program goes to a step 74 where the flag is reset so that the control unit 2 enters the slave mode.

At step 75, the diagnosis program stored in the ROM 5 is performed. The program returns to step 70 from step 75 or 74 and waits for the next input signal from the diagnostic device 25.

After the initial program, the diagnostician inputs the data code, so that the program goes to the step 76 from the step 71. At step 76, it is determined whether the control unit 2 is currently in the master mode or not in accordance with the flag. If the master mode is determined, the program proceeds to a step 77 where the input code input by the keyboard 32 is interpreted at the keyboard input interpreting means 53 and an address of the RAM 4 which stores the corresponding diagnosis data is addressed in accordance with the diagnosis program. The program goes to a step 79.

If slave mode is determined at step 76, the program proceeds to a step 78 where the command applied from the diagnostic device 25 is interpreted at the command interpreting means 52 in accordance with the program of the diagnostic device 25, and the program goes to step 79. In this case, addressing of the diagnosis program stored in the RAM 4 is performed in accordance with the command from the device 25. At step 79, diagnosis data stored in the predetermined address of the RAM 4 is picked up at the data pickup means 54 in accordance with the signal from the interpreting means 53 or 52.

The program proceeds to a step 80 where it is again determined whether the flag is set or reset. If the flag is set, the program proceeds to a step 81 where the data of the binary digits stored in RAM 4 is converted into the decimal digits. At a step 82, the converted data is transmitted to the diagnostic device 25 from the data communication means 50.

If the flag is reset, the program goes to step 82 where the data of binary digits is transmitted to the diagnostic device 25.

Accordingly, when the control unit 2 is in the master mode, the control unit 2 automatically operates to execute addressing the stored ordinary diagnosis program and the conversion for the data display and to transmit data to the diagnostic device 25 without selecting the program. Thus, the diagnosis is performed without recognizing the type and mode of the motor vehicle and types of sensors, actuators, and electronic control unit.

In addition to the ordinary diagnosis, for example, when a statistic processing of the diagnosis data is performed, the cartridge 34 is changed to another cartridge having a corresponding program.

Figure 5A:
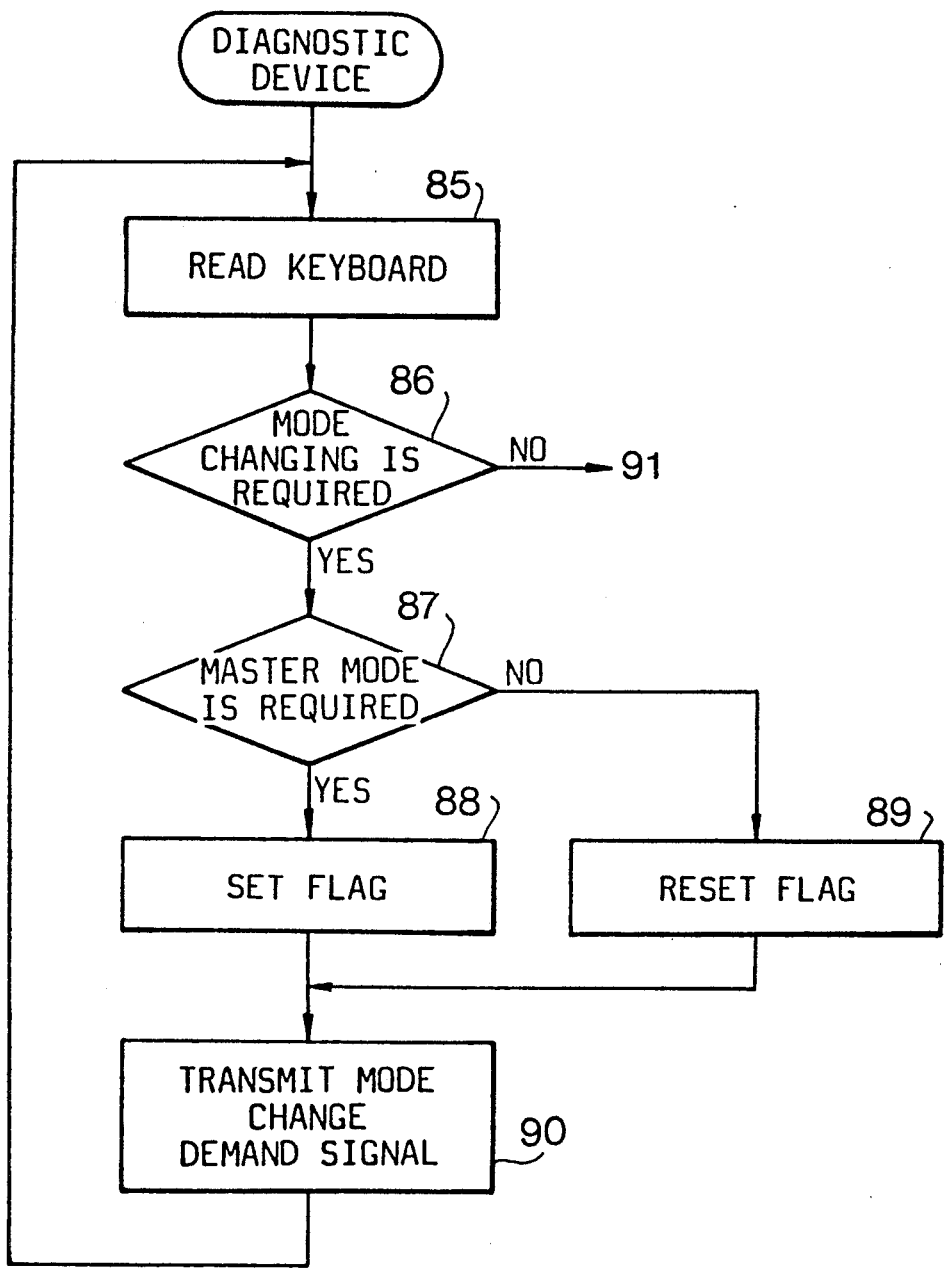
FIGS. 5a and 5b are flowcharts showing diagnosis operation of a diagnostic device of the diagnostic system.
Figure 5B:
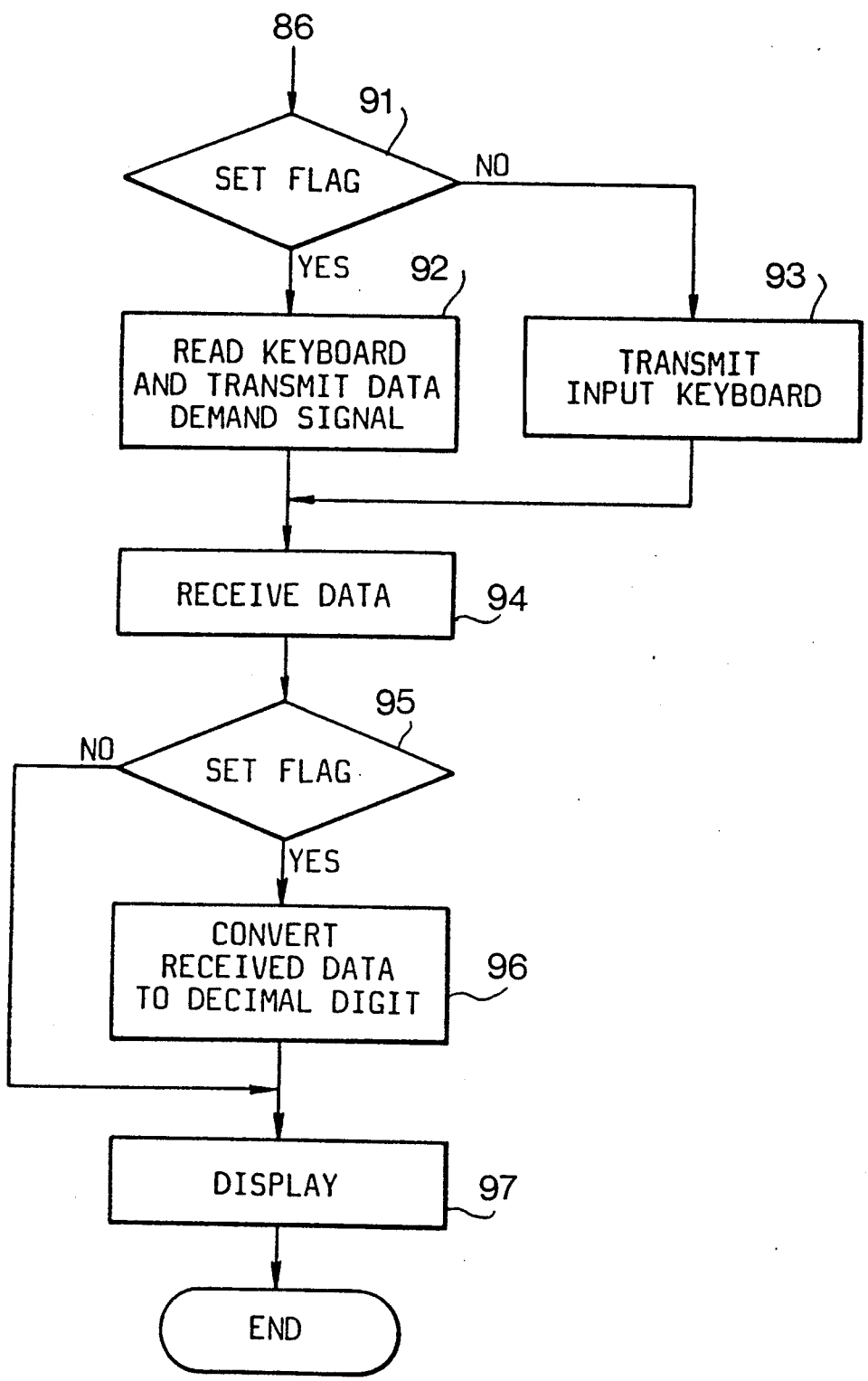
Figure 6:
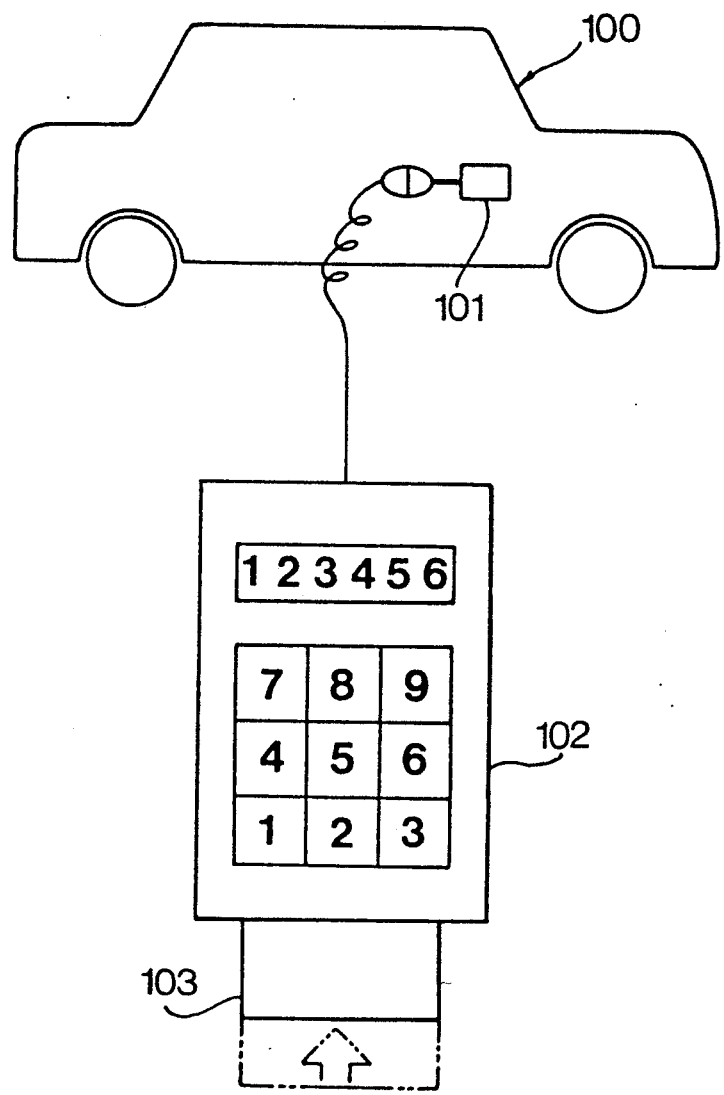
FIG. 6 is a schematic illustration of a conventional diagnostic system.

The operation of the diagnostic device 25 is hereinafter described with reference to the flowchart of FIGS. 5a, 5b.

At a step 85, a predetermined command for designating the diagnostic device 25 as the master is input by operating the keyboard 32. The keyboard input interpreting means 60 interprets the input command. At a step 86, it is determined whether mode changing is required or not. Since mode changing is required, the program goes to a step 87. At the step 87, it is determined whether the master mode is required or not. The requirement for the master mode is determined, and a flag is set at a step 88 At a step 90, the master/slave mode designating means 61 produces a slave designating signal which is transmitted to the control unit 2 through the data communication means 62, and the statistic processing program stored in the ROM 41 is performed. The program returns to step 85 and waits for the next input. The control unit 2 enters slave mode.

After the program, if the ordinary diagnosis is necessary, the program proceeds to a step 89 where the flag is reset. At step 90, a master designating signal is applied to the control unit 2, and the diagnostic device 25 enters slave mode.

When the diagnostician operates the keyboard 32 to input a code for demanding transmission of a plurality of data stored in the RAM 4 of the control unit 2, the program goes to a step 91 by way of steps 85 and 86. At the step 91, it is determined whether the diagnostic device 25 is currently in the master mode or not in accordance with the flag. If the master mode is determined, the program proceeds to a step 92 where the input code is interpreted at the input interpreting means 60. A plurality of addresses of the RAM 4, which store corresponding diagnosis data, are addressed and a demand signal for transmitting the diagnosis data is applied to the control unit 2 from the data communication means 62. The program goes to a step 94.

If the slave mode is determined at step 91, the program proceeds to a step 93 where the input code input by operating the keyboard 32 is applied to the control unit 2 through the data communication means 62. The program goes to step 94 where a plurality of data fed from the control unit 2 are received in the diagnostic device 25. When the receiving data terminates, the program proceeds to a step 95 where it is again determined whether the flag is set or reset. If the flag is set, the program proceeds to a step 96 where the received binary digit representing the diagnosis data is converted into decimal digit in accordance with a predetermined conversion rate. For example, the mean value of data is calculated and an output signal is supplied to the display driving means 63.

At step 95, if the flag is reset, the diagnosis data fed from the control unit 2 is applied to the display driving means 63 and the program goes to a step 97. At step 97, the diagnosis data applied to the display driving means 63 is displayed on the display 31.

Thus, the diagnostic device 25 is provided with additional functions such as a trouble diagnosis, a statistical processing of diagnosis data, and a detailed diagnosis of a particular sensor or actuator Further, the change between the master mode and the slave mode of the control unit 2 or the diagnostic device 25 is easily performed in an instant in accordance with a predetermined input code so that various programs are easily performed, thereby improving operability.

In accordance with the present invention, the control system of the motor vehicle and the externally provided diagnostic device are alternately designated as the master mode and slave mode in response to an input through the keyboard of the diagnostic device. When the control system is in the master mode and the diagnostic device is in the slave mode, the ordinary diagnosis is performed regardless of differences in the type of the motor vehicle, sensors and actuators provided in the motor vehicle, and control systems. When the control unit 2 is in the slave mode and the diagnostic device 25 is in master mode, a diagnosis other than the ordinary diagnosis can be easily performed.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A diagnostic system for diagnosing an electronic control system which controls an engine mounted on a motor vehicle, said electronic control system having sensing means for detecting operating conditions of said engine and first memory means for storing data from said sensing means, said diagnostic system comprising:

- a diagnostic device comprising a display for displaying diagnosis data, a control unit for controlling the operations of said diagnosis device, a keyboard for inputting signals into said control unit of said diagnostic device, and connecting means for connecting said diagnostic device with said electronic control system;
- second memory means provided in said control unit of said diagnostic device for storing first programs provided to perform a particular diagnosis with respect to said electronic control system;
- third memory means being provided in said electronic control system for storing second programs to diagnosis said electronic control system in which said third memory means is provided and to control the engine respectively;
- designating means responsive to input signals of said keyboard for selectively designating the electronic control system or the diagnostic device either as a master or a slave to provide master mode or slave mode; and wherein
- when said electronic control system is designated in the master mode and the diagnostic device is designated in the slave mode, the diagnosis of said electronic control system is performed by said second programs, and when said electronic control system is designated in the slave mode and the diagnostic device is designated in the master mode, the diagnosis of said electronic control system is performed by said first programs.

2. A system according to claim 1, wherein said designating means is provided in said diagnostic device.

3. A system according to claim 1, wherein said first programs include a program for a particular diagnosing of an element of said electronic control system.

4. A system according to claim 3, wherein said element of said electronic control system is a sensing means of said electronic control system.

5. A system according to claim 3, wherein said element of said electronic control system is an actuator of said electronic control system.

6. A system according to claim 1, wherein said first programs include a program for performing a trouble diagnosis of said electronic control system.

7. A system according to claim 1, wherein said first program include a program for statistically processing said diagnosis data.

8. A system according to claim 1, wherein said second programs stored in said third memory means include an ordinary program for diagnosing said electronic control system in which said third memory means is provided.

* * * * *